US010873338B1

(12) United States Patent
Zhao et al.

(10) Patent No.: US 10,873,338 B1
(45) Date of Patent: Dec. 22, 2020

(54) CALIBRATION METHOD FOR PRECISION SIGNAL CHAIN LINEARITY (71) Applicant: Analog Devices International Unlimited Company, Limerick (IE)

(72) Inventors: Yao Zhao, Xi'an (CN); Aine McCarthy, Carrigaline (IE); Shuchun Xie, Beijing (CN); Ke Wei, Beijing (CN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/526,298

(22) Filed: Jul. 30, 2019

(51) Int. Cl.
*H03M 1/10* (2006.01)
(52) U.S. Cl.
CPC .................. *H03M 1/1038* (2013.01)
(58) Field of Classification Search
CPC ..... H03M 1/1038; H03M 1/124; H03M 1/121
USPC .................. 341/118, 120, 122, 144, 155, 61
See application file for complete search history.

(56) References Cited

U.S. PATENT DOCUMENTS

| 4,034,291 | A | 7/1977 | Allen et al. |
| 4,200,933 | A | 4/1980 | Nickel et al. |
| 4,924,225 | A | 5/1990 | Dingwall et al. |
| 5,548,286 | A | 8/1996 | Craven |
| 7,202,805 | B2 * | 4/2007 | Sherry ............... H03F 1/34 341/120 |
| 8,416,105 | B2 | 4/2013 | Lai et al. |
| 9,929,739 | B1 | 3/2018 | Zanchi |

| 2010/0164767 | A1* | 7/2010 | Oshima ............ H03M 1/1004 341/120 |
| 2012/0001783 | A1* | 1/2012 | Eklund ............ H03M 1/0675 341/118 |
| 2012/0119930 | A1* | 5/2012 | Kumar ............ H03F 3/45475 341/118 |
| 2012/0212359 | A1* | 8/2012 | Lai ................ H03M 1/1061 341/120 |

(Continued)

FOREIGN PATENT DOCUMENTS

| CN | 103067008 B | 9/2016 |
| CN | 104168023 B | 12/2017 |
| EP | 2666028 A1 | 11/2013 |

OTHER PUBLICATIONS

"ADS890xB 20-Bit, High-Speed SAR ADCs With Integrated Reference Buffer, and Enhanced Performance Features", Texas Instruments Data Sheet, (Jun. 2017), 77 pgs.

(Continued)

*Primary Examiner* — Peguy Jean Pierre
(74) *Attorney, Agent, or Firm* — Schwegman Lundberg & Woessner, P.A.

(57) ABSTRACT

An electronic circuit comprises an input voltage circuit, an analog-to-digital converter (ADC) circuit, and logic circuitry. The input voltage circuit is configured to generate multiple input voltages. The ADC circuit is configured to convert the multiple input voltages to first digital values using the first longer ADC acquisition time and convert the multiple input voltages to second digital values using the second shorter ADC acquisition time. The logic circuitry is configured to determine calibration information for the ADC circuit using the first digital values and the second digital values, and scale analog-to-digital (A/D) conversion results of the ADC circuit using the calibration information.

20 Claims, 5 Drawing Sheets

(56) References Cited

U.S. PATENT DOCUMENTS

| | | | |
|---|---|---|---|
| 2016/0079994 A1* | 3/2016 | Lee | H03M 1/002 |
| | | | 341/118 |
| 2016/0094238 A1 | 3/2016 | Kang | |
| 2019/0081634 A1 | 3/2019 | Kulkarni et al. | |

OTHER PUBLICATIONS

"Evaluation of the Performance of a State of the Art Digital Multimeter", Keysight Technologies White Paper, (Dec. 14, 2018), 23 pgs.

"MAX11270—24-Bit, 10mW, 130dB SNR, 64ksps Delta-Sigma ADC with Integrated PGA", Maxim Integrated Products, Inc. Data Sheet, (2015), 47 pgs.

Hoover, Guy, "DC Accurate Driver for the LTC2377-20 Achieves 2ppm Linearity—Design Note 1032", Linear Technology Design Notes, (2013), 3 pgs.

* cited by examiner

CALIBRATION METHOD FOR PRECISION SIGNAL CHAIN LINEARITY

FIELD OF THE DISCLOSURE

This document relates to integrated circuits and in particular to calibration circuits for analog-to-digital converter (ADC) circuits.

BACKGROUND

Electronic systems can include analog-to-digital (A/D) converters (ADCs). Converting analog signals to digital quantities allows processors of electronic systems to perform signal processing functions for the systems. The delta-sigma ADC is one type of ADC and is widely used in converting signals in the audio band, in precision industrial measurement applications. Some ADCs are high precision ADCs and can include twenty or more bits. Because of the large difference in scale between the most significant bit (MSB) an the least significant bit (LSB), a high precision ADC typically needs calibration to operate with the desired accuracy. However, the calibration process uses equipment that is costly and difficult to operate.

SUMMARY OF THE DISCLOSURE

This document relates generally to analog-to-digital converter (ADC) circuits and more particularly to calibration of precision ADC circuits.

In some aspects, an electronic circuit comprises an input voltage circuit, an analog-to-digital converter (ADC) circuit, and logic circuitry. The input voltage circuit is configured to generate multiple input voltages. The ADC circuit is configured to convert the multiple input voltages to first digital values using the first longer ADC acquisition time and convert the multiple input voltages to second digital values using the second shorter ADC acquisition time. The logic circuitry is configured to determine calibration information for the ADC circuit using the first digital values and the second digital values, and scale analog-to-digital (A/D) conversion results of the ADC circuit using the calibration information In some aspects, a method of operating an ADC circuit comprises: applying multiple input voltages to the input of the ADC circuit; converting the multiple input voltages to first digital values using a first ADC acquisition time; converting the multiple input voltages to second digital values using a second ADC acquisition time shorter than the first ADC acquisition time; determining calibration information for the ADC circuit using the first digital values and the second digital values; and scaling A/D conversion results of the ADC circuit using the calibration information.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

High precision ADCs typically need calibration to operate with the desired accuracy. A high precision signal generator applies highly accurate signals to the input of the ADC and the results of the ADC are determined. A highly accurate reference signal is also needed for determining results of intermediate stages of the analog-to-digital (A/D) conversions. A/D conversion results are compared to desired results to determine calibration information. The calibration information is used to convert A/D conversions to calibrated A/D conversions.

Figure 1:
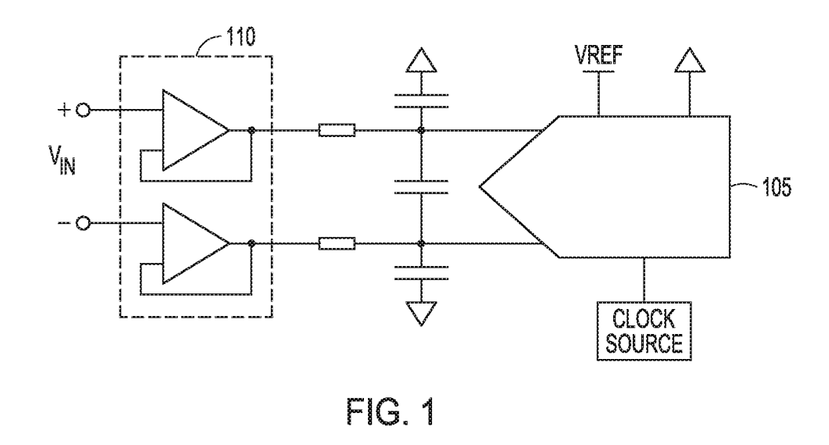
FIG. 1 is a block diagram of a signal chain that includes a differential analog-to-digital converter (ADC) circuit.

FIG. 1 is a block diagram of a signal chain that includes a differential ADC circuit. The ADC circuit 105 converts the analog differential input $V_{IN}$ to a digital value. An analog buffer circuit 110 buffers $V_{IN}$ before it is sampled by the ADC circuit 105. One error source in the signal chain is the front-end analog buffer circuit 110. To achieve an accuracy specification (e.g., one part-per-million integral nonlinearity, or ±1 ppm INL), the buffer should charge the sampling capacitor of the ADC circuit to within the specified accuracy within the circuit sampling time.

Figure 2:
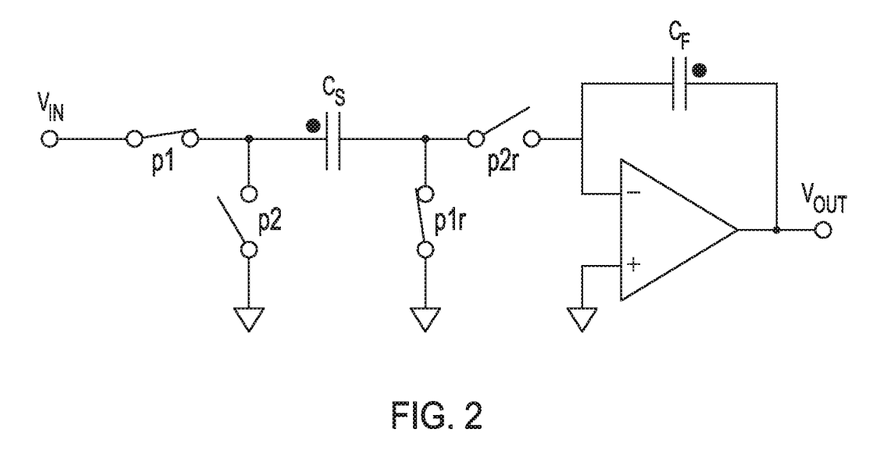
FIG. 2 is a simplified diagram of a sampling circuit for an ADC circuit.

FIG. 2 is a simplified diagram of portions of a sampling circuit of a Sigma Delta ADC. Voltage $v_{IN}$ is from provided by a buffer circuit, and voltage $v_{OUT}$ is applied to the ADC. If the voltage on the sampling capacitor $C_S$ does not settle in the operating sampling time, the INL specification will not meet the desired specification. Increasing the sampling time to longer than the operating sampling time provides a longer signal acquisition time that will allow for sufficient time to charge $C_S$. The sampling time is typically derived from the circuit clock signal. Slowing down the circuit clock signal is another way to increase the sampling time and allow for sufficient time to charge $C_S$. The calibration using the longer sampling time (i.e., lower sampling rate) can be used to determine the calibration at the shorter operating sampling time (i.e., faster operating sample rate).

Figure 3:
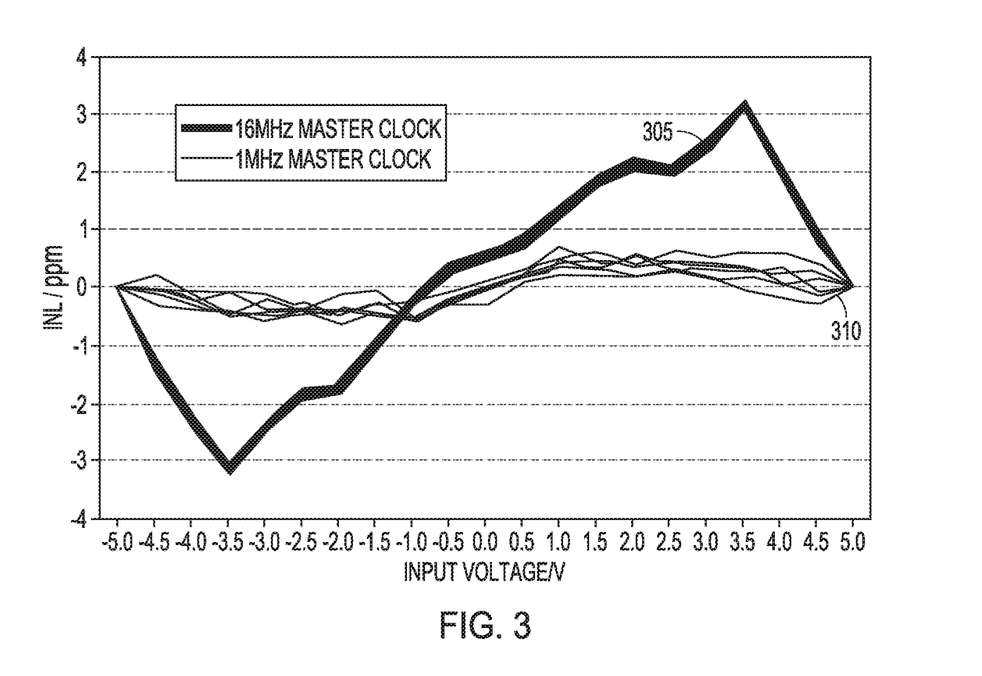
FIG. 3 are graphs of integral nonlinearity (INL) versus input voltage for an ADC circuit.

FIG. 3 are graphs of INL versus input voltage for an ADC circuit. Waveform 305 represents the results for a 16-megahertz (16 MHz) circuit clock signal and waveform 310 represents the results for a 1 MHz circuit clock signal. The "S" curve shape of waveform 305 is related to the insufficient charging of the sampling capacitor due to the fast clock frequency. Waveform 310 shows that linearity is improved with the slower circuit and the slower sampling rate.

Figure 4:
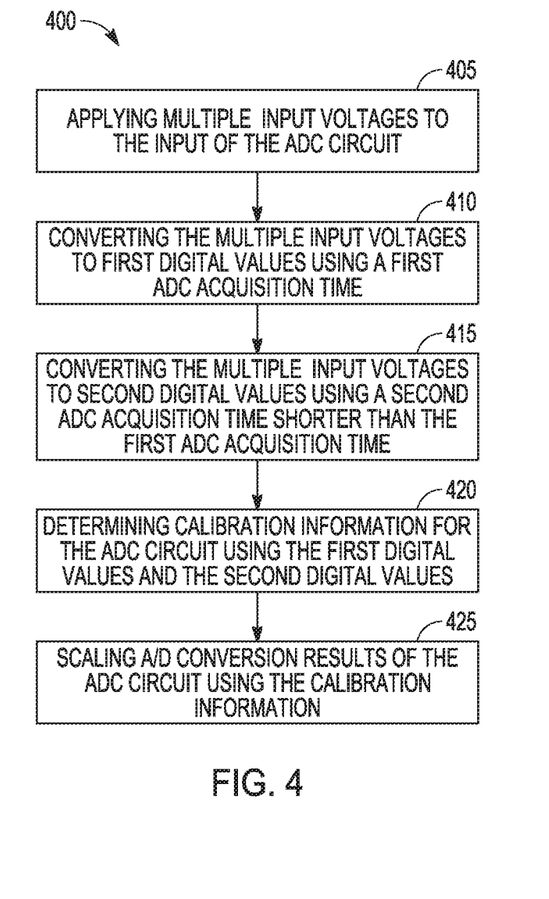
FIG. 4 is a flow diagram of an example of a method 400 of operating a precision ADC circuit.

FIG. 4 is a flow diagram of an example of a method 400 of operating a precision ADC circuit. The method includes calibrating the signal chain for a precision ADC. At 405, multiple input voltages are applied to the input of the ADC circuit (e.g., N input voltages where N≥1). In certain aspects N=10, in other aspects N=50. In certain aspects the input voltages are differential input voltages. For each input voltage $v_n$ where $0 \leq n \leq N-1$, at 310 the input voltage is converted to a first digital value $y_n$ using a first ADC acquisition time. The acquisition time or sample time may be the time an input voltage is applied to a sampling capacitor of the ADC circuit. At 415, each input voltage is converted to a second digital value $x_n$ using a second ADC acquisition time that is shorter than the first ADC acquisition time. In certain aspects, the second ADC acquisition time is the operating ADC acquisition time. The order of the conversions is not important and the conversions with the shorter ADC circuit clock frequency to determine the $x_n$ values could be performed first. The result is a first array of digital values determined using the first longer ADC acquisition time $$\{y_0, y_1, y_2 \ldots y_{N-1}\},$$

and a second array of digital values determined using the second shorter ADC acquisition time $$\{x_0, x_1, x_2 \ldots x_{N-1}\},$$

for an array of input voltages $$\{v_0, v_1, v_2 \ldots v_{N-1}\}.$$

At 420, calibration information is determined for the ADC circuit using the first digital values and the second digital values. At 425, the analog-to-digital (A/D) conversion results of the ADC circuit operating with the shorter ADC acquisition time are scaled using the calibration information.

Figure 5:
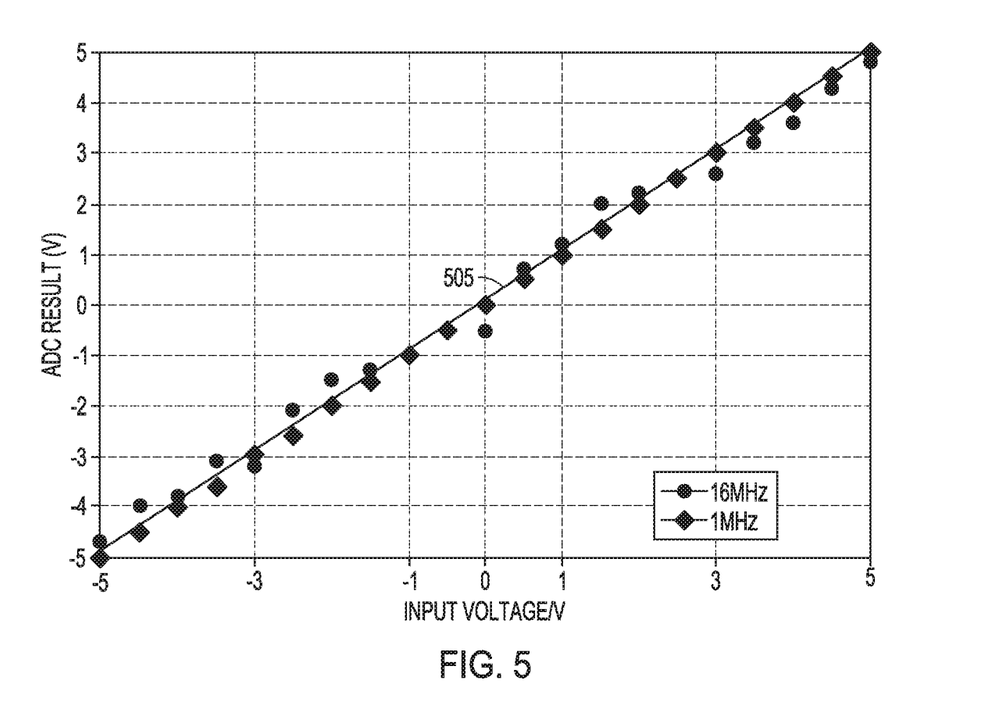
FIG. 5 is a graph of the digital values for the ADC results versus input voltage.

FIG. 5 is a graph of the digital values for the ADC results versus input voltage. A line 505 is drawn through ADC results for the longer ADC acquisition time (the first array of digital values, $y_0, y_1, y_2 \ldots y_{N-1}$). The scaling translates the values of the results at the shorter ADC acquisition time to the more accurate values of the longer ADC acquisition time.

According to some aspects, the scaling is calculated using equations. The equations for the calibration scaling are given below. For $x_n < x < x_{n+1}$, and $0 < n < N-1$, $$k_n = (y_{n+1} - y_n)/(x_{n+1} - x_n),$$

$$b_n = y_n - k_n \cdot x,$$

$$y = k_n \cdot x + b_n, \quad (1)$$

where $k_n$ is the gain error and $b_n$ is the offset error. Equation (1) can be used to scale the digital value (x) obtained at the shorter and faster ADC acquisition time to the more accurate digital value (y) of the longer and slower ADC acquisition time. The values of $k_n$ and $b_n$ can be derived using the calibration information form the measurements. It is to be noted that the precision of the scaling is not dependent on the precision of the input voltage. Thus, exact of knowledge of the input voltage is not necessary, which allows lower cost instrumentation to be used for the calibration.

According to some aspects, the scaling is recorded in memory of the calibration circuitry, such as a look-up table for example. The lookup table stores the more accurate digital values for the slower A/D conversions in association with the digital values determined using the faster A/D conversions. An A/D conversion result at the shorter ADC acquisition time is replaced with the corresponding digital value of the longer ADC acquisition time.

Figure 6:
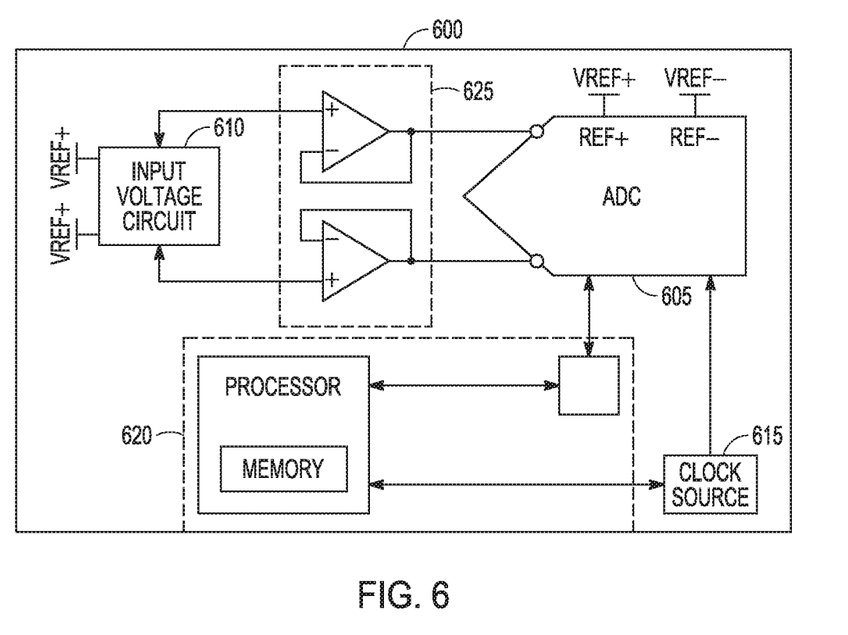
FIG. 6 is a block diagram of an example of an electronic circuit that includes an ADC circuit and calibration circuitry.

FIG. 6 is a block diagram of an example of an electronic circuit 600 that includes an ADC circuit 605 and calibration circuitry. The ADC circuit 605 may be a precision ADC circuit that produces a 20-bit result or more, and the calibration circuitry is used to calibrate the ADC circuit 605. The calibration circuitry includes an input voltage circuit 610, a clock circuit 615, and logic circuitry 620. The calibration circuitry may also include a buffer circuit 625.

The input voltage circuit 610 generates multiple input voltages to the ADC circuit 605 using calibration reference voltages $V_{REF+}$, $V_{REF-}$. An A/D conversion by the ADC circuit includes a comparison of voltage from charge stored on capacitors to a reference voltage. This comparison is used by the ADC circuit to make a bit decision or a bit trial during the conversion. The ADC circuit 605 uses the same calibration reference voltages $V_{REF+}$, $V_{REF-}$, or a voltage derived from $V_{REF+}$, $V_{REF-}$ to perform A/D conversions. This reduces noise in the calibration and allows less expensive calibration equipment to be used.

Figure 7:
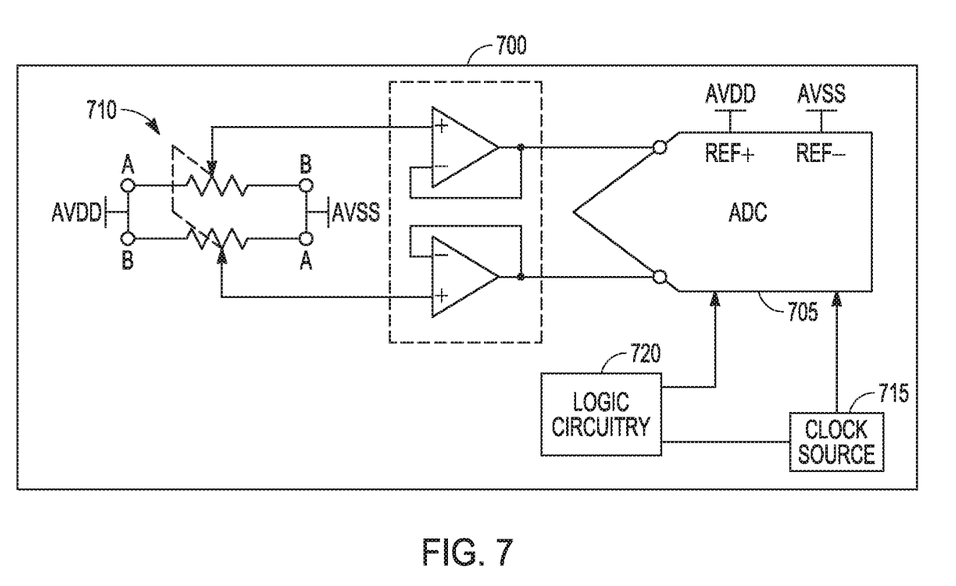
FIG. 7 is a block diagram of another example of an electronic circuit that includes an ADC circuit and calibration circuitry.

In some aspects, the input voltage circuit 610 generates multiple differential input voltages and the buffer circuit 625 is a differential buffer circuit. FIG. 7 is a block diagram of another example of an electronic circuit 700 that includes an ADC circuit 705 and calibration circuitry. The calibration circuitry includes an input voltage circuit 710, a clock circuit 715, and logic circuitry 720. In the example, the input voltage circuit 710 includes a potentiometer circuit to generate the differential input voltages. The calibration reference voltage AVDD is applied to the potentiometer circuit and the potentiometer is adjusted to generate the different input voltages.

Figure 8:
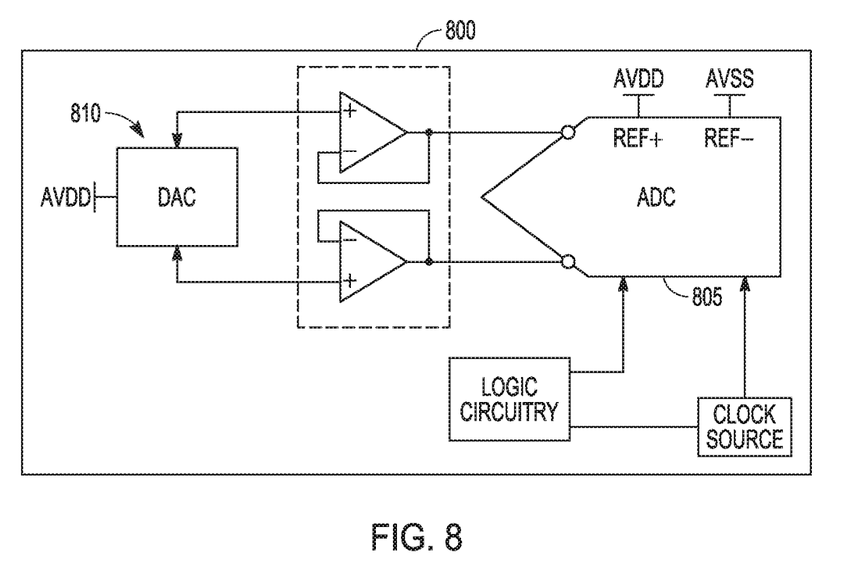
FIG. 8 is a block diagram of still another example of an electronic circuit that includes an ADC circuit and calibration circuitry.

FIG. 8 is a block diagram of another example of a block diagram of another example of an electronic circuit 800 that includes an ADC circuit 805 and calibration circuitry. The input voltage circuit 810 includes a digital-to-analog converter (DAC) circuit to generate the multiple differential input voltages. In variations, the DAC circuit may be a resistive DAC circuit and the calibration reference voltage is divided using a string of resistive circuit elements to generate the differential input voltages that are applied to the ADC circuit.

Returning to FIG. 6, the clock circuit 615 generates a sample clock signal that determines the ADC acquisition time or sampling time. The sample clock signal can have a slower frequency corresponding to a first longer ADC acquisition time and a faster frequency corresponding a second shorter ADC acquisition time. The frequencies of the sample clock signal can be changed by changing the circuit clock signal of the clock circuit. In some aspects, the shorter ADC acquisition time corresponds to a clock signal with a frequency an order of magnitude higher than the clock signal corresponding to the longer ADC acquisition time. In variations, the longer ADC acquisition time corresponds to a 1 MHz circuit clock signal and the shorter ADC acquisition time corresponds to a 16 MHz circuit clock signal. The ADC circuit 605 converts the multiple differential input voltages to first digital values using the slower clock frequency and converts the multiple input voltages to second digital values using the faster clock frequency.

The logic circuitry 620 determines calibration information for the ADC circuit using the first digital values and the second digital values. In some aspects, the logic circuitry 620 is included on the same integrated circuit (IC) as the ADC circuit. The logic circuitry 620 may include a processor executing instructions to determine the calibration information. In some aspects, the logic circuitry 620 includes a state machine or sequencer that sequentially advances through a fixed series of steps to perform functions to determine the calibration information. In some aspects, the logic circuitry 620 is external to the IC that includes the ADC circuit. The external logic circuitry may be a processor included in a computer (e.g., a PC or personal computer) external to the IC that includes the ADC circuit.

The logic circuitry 620 may advance the ADC circuit 605 through conversions of the input voltages using the higher clock frequency to produce an array of digital values (e.g., $x_0, x_1, x_2 \ldots x_{N-1}$) and conversions of the input voltages using the lower clock frequency to produce another array of digital values (e.g., $y_0, y_1, y_2 \ldots y_{N-1}$). In some aspects, the A/D conversions are performed as a loop. For instance, the logic circuitry may apply a first input voltage $v_0$ to the input of the ADC circuit for conversion when the ADC circuit is operated using the higher frequency clock and then changes operation of the ADC circuit to the lower frequency clock. The logic circuitry then advances to the next input voltage $v_1$ and the A/D conversion with the lower frequency clock and higher frequency clock are again performed. This process continues for all of the input voltages to be converted.

In certain aspects, the frequency of each input voltage is changed and A/D conversions are performed at multiple frequencies for each input voltage using both ADC acquisition times. This provides frequency response information for the calibration.

The calibration information determined by the logic circuitry using the digital values of the two ADC acquisition times is used to scale A/D conversion results of the normal operation of the ADC circuit. In some aspects, the the logic circuitry calculates or derives a value of a specified calibration function using the calibration information. For example, equation (1) may be the specified calibration function. The logic circuitry converts a subsequent A/D conversion result into a calibrated A/D conversion using values determined using the specified calibration function.

In some aspects, the calibration circuitry includes a memory circuit. The memory circuit may be separate from or integral to the logic circuitry. The memory circuit stores a look-up table that includes the calibration information. For instance, the look-up table may store a scaled A/D conversion value for a corresponding A/D conversion value determined under normal operation. The scaled A/D conversion values can be the conversion values determined using the longer acquisition time.

Either approach can be used to scale the results of a high precision ADC circuit. In some aspects, the ADC circuit 605 produces a digital result of twenty bits or more. The logic circuitry may scale analog-to-digital (A/D) conversion results to within ±1 ppm accuracy.

The devices, systems and methods described herein provide calibration for ADC circuits. The calibration is especially advantageous for high precision ADC circuits. The same reference voltage is used in the AD conversions and to generate the input voltage to the ADC circuit. This reduces circuit noise. Also, the calibration method doesn't require that the input voltage is known with high precision. This allows less expensive equipment to be used. Accuracies of ±1 ppm INL are possible.

Additional Description and Aspects

Aspect 1 can include subject matter (such as an electronic circuit) comprising an input voltage circuit, an analog-to-digital converter (ADC) circuit, and logic circuitry. The input voltage circuit is configured to generate multiple input voltages, and the ADC circuit is configured to convert the multiple input voltages to first digital values using the first longer ADC acquisition time and convert the multiple input voltages to second digital values using the second shorter ADC acquisition time. The logic circuitry is configured to determine calibration information for the ADC circuit using the first digital values and the second digital values, and scale analog-to-digital (A/D) conversion results of the ADC circuit using the calibration information.

In Aspect 2, the subject matter of Aspect 1 optionally includes an input voltage circuit is configured to generate multiple differential input voltages using a reference voltage, and the ADC circuit is configured to convert the multiple differential input voltages to the first and second digital values using the reference voltage.

In Aspect 3, the subject matter of Aspect 2 optionally includes an input voltage circuit that includes a potentiometer circuit configured to generate the multiple differential input voltages.

In Aspect 4, the subject matter of Aspect 2 optionally includes a digital-to-analog converter (DAC) circuit configured to generate the multiple differential input voltages.

In Aspect 5, the subject matter of one or any combination of Aspects 2-4 optionally includes a differential buffer circuit arranged to receive the multiple differential input voltages generated using the reference voltage and apply the received multiple differential input voltages to the ADC circuit. The logic circuitry is optionally configured to scale the A/D conversion results of the applied differential input.

In Aspect 6, the subject matter of one or any combination of Aspects 1-5 optionally includes a memory circuit configured to store a look-up table that includes the calibration information. The logic circuitry is optionally configured to convert a subsequent A/D conversion result into a calibrated A/D conversion using the look-up table.

In Aspect 7, the subject matter of one or any combination of Aspects 1-6 optionally includes logic circuitry configured to determine a value of a specified calibration function using the calibration information and convert a subsequent A/D conversion result into a calibrated A/D conversion using the determined value of the specified calibration function.

In Aspect 8, the subject matter of one or any combination of Aspects 1-7 optionally includes an ADC circuit that produces a digital result of twenty bits or more.

In Aspect 9, the subject matter of one or any combination of Aspects 1-8 optionally includes a clock circuit configured to generate the first ADC acquisition time using a circuit clock signal at a first clock frequency and generate the second ADC acquisition time using the circuit clock signal at a second clock frequency an order of magnitude higher than the first clock frequency.

Aspect 10 can include subject matter (such as a method of operating an analog-to-digital converter (ADC) circuit), or can optionally be combined with one or any combination of Aspects 1-9 to include such subject matter, comprising: applying multiple input voltages to the input of the ADC circuit; converting the multiple input voltages to first digital values using a first ADC acquisition time; converting the multiple input voltages to second digital values using a second ADC acquisition time shorter than the first ADC acquisition time; determining calibration information for the ADC circuit using the first digital values and the second digital values; and scaling analog-to-digital (A/D) conversion results of the ADC circuit using the calibration information.

In Aspect 11, the subject matter of Aspect 10 optionally includes generating the multiple differential input voltages using a reference voltage and converting the multiple differential input voltages to the first and second digital values using the reference voltage used to generate the multiple differential input voltages.

In Aspect 12, the subject matter of Aspect 11 optionally includes dividing the reference voltage using a potentiometer circuit to generate the multiple differential input voltages.

In Aspect 13, the subject matter of Aspect 11 optionally includes dividing the reference voltage using a digital to analog converter (DAC) circuit to generate the multiple differential input voltages.

In Aspect 14, the subject matter of one or any combination of Aspects 10-13 optionally includes storing the calibration information as a look-up table in a memory circuit; determining a subsequent A/D conversion result using the ADC circuit; and scaling the A/D conversion result to a calibrated A/D conversion using the look-up table.

In Aspect 15, the subject matter of one or any combination of Aspects 10-14 optionally includes deriving a value of a specified calibration function using the calibration information, determining a subsequent A/D conversion result using the ADC circuit, and scaling the A/D conversion result to a calibrated A/D conversion using the derived value of the calibration function.

In Aspect 16, the subject matter of one or any combination of Aspects 10-15 optionally includes converting the multiple input voltages to the first digital values using a first ADC acquisition time that is an order of magnitude longer than the second ADC acquisition time.

In Aspect 17, the subject matter of one or any combination of Aspects 10-16 optionally includes converting the multiple differential input voltages to digital values having greater than twenty bits.

Aspect 18 can include subject matter (such as a computer readable storage medium including instructions that, when performed by a controller processor of a calibration device coupled to an analog-to-digital converter (ADC) circuit, causes the calibration device to perform steps) or can optionally be combined with one or any combination of Aspects 1-17 to include such subject matter, including instructions that cause the calibration device to perform steps comprising: applying multiple differential input voltages to an input of the ADC circuit; receiving first digital values from the ADC circuit representing analog-to-digital (A/D) conversions of the multiple differential input voltages using a first ADC sample time; receiving second digital values from the ADC circuit representing A/D conversions of the multiple differential input voltages using a second ADC sample time shorter than the first ADC sample time determining calibration information for the ADC circuit using the first digital values and the second digital values; and providing the calibration information to the ADC circuit for subsequent A/D conversions.

In Aspect 19, the subject matter of Aspect 18 optionally includes instructions that cause the calibration device to perform steps including generating the multiple differential input voltages using a calibration reference voltage that is used by the ADC circuit to convert the multiple differential input voltages into the first and second digital values.

In Aspect 20, the subject matter of one or both of Aspects 18 and 19 optionally include instructions that cause the calibration device to perform steps including storing the calibration information as a look-up table in a memory circuit coupled to the ADC circuit, the look-up table used by the ADC circuit to scale a subsequent A/D conversion result to a calibrated A/D conversion.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
   an input voltage circuit configured to generate multiple input voltages in a calibration mode using a reference voltage;
   an analog-to-digital converter (ADC) circuit configured to, in the calibration mode, both convert the multiple input voltages to first digital values using a first longer ADC acquisition time, convert the same multiple input voltages to second digital values using a second shorter ADC acquisition time, and in a non-calibration mode perform analog-to-digital (A/D) conversions using the reference voltage; and logic circuitry configured to determine calibration information for the ADC circuit using the first digital values of the first longer ADC acquisition time and the second digital values of the second shorter ADC acquisition time of the calibration mode, and in the non-calibration mode scale A/D conversion results of the ADC circuit using the calibration information.

2. The electronic circuit of claim 1, wherein the input voltage circuit is configured to generate multiple differential input voltages using the reference voltage, and the ADC circuit is configured to convert the multiple differential input voltages to the first and second digital values using the reference voltage.

3. The electronic circuit of claim 2, wherein the input voltage circuit includes a potentiometer circuit configured to generate the multiple differential input voltages.

4. The electronic circuit of claim 2, wherein the input voltage circuit includes a digital-to-analog converter (DAC) circuit configured to generate the multiple differential input voltages.

5. The electronic circuit of claim 2, including:
a differential buffer circuit arranged to receive the multiple differential input voltages generated using the reference voltage and apply the received multiple differential input voltages to the ADC circuit; and
wherein the logic circuitry is configured to scale the A/D conversion results of the applied differential input.

6. The electronic circuit of claim 1, including:
a memory circuit configured to store a look-up table that includes the calibration information; and
wherein the logic circuitry is configured to convert a subsequent A/D conversion result into a calibrated A/D conversion using the look-up table.

7. The electronic circuit of claim 1, wherein the logic circuitry is configured to:
determine a value of a specified calibration function using the calibration information; and
convert a subsequent A/D conversion result into a calibrated A/D conversion using the determined value of the specified calibration function.

8. The electronic circuit of claim 1, wherein the ADC circuit produces a digital result of twenty bits or more.

9. The electronic circuit of claim 1, including a clock circuit configured to generate the first ADC acquisition time using a circuit clock signal at a first clock frequency and generate the second ADC acquisition time using the circuit clock signal at a second clock frequency an order of magnitude higher than the first clock frequency.

10. A method of operating an analog-to-digital converter (ADC) circuit, the method comprising:
applying, in a calibration mode, multiple input voltages to the input of the ADC circuit, wherein the multiple input voltages are generated using a reference voltage;
converting the multiple input voltages to first digital values using a first ADC acquisition time during the calibration mode;
converting the same multiple input voltages to second digital values using a second ADC acquisition time shorter than the first ADC acquisition time during the calibration mode;
determining calibration information for the ADC circuit using the first digital values of the first longer ADC acquisition time and the second digital values of the second shorter ADC acquisition time;

performing analog-to-digital (A/D) conversions by the ADC circuit in a non-calibration mode using the reference voltage; and scaling (A/D) conversion results of the ADC circuit in a non-calibration mode using the calibration information.

11. The method of claim 10, wherein converting the multiple input voltages includes:
generating the multiple differential input voltages using the reference voltage; and
converting the multiple differential input voltages to the first and second digital values using the reference voltage used to generate the multiple differential input voltages.

12. The method of claim 11, wherein generating the multiple differential input voltages includes dividing the reference voltage using a potentiometer circuit to generate the multiple differential input voltages.

13. The method of claim 11, wherein generating the multiple differential input voltages includes dividing the reference voltage using a digital to analog converter (DAC) circuit to generate the multiple differential input voltages.

14. The method of claim 10, including:
storing the calibration information as a look-up table in a memory circuit;
determining a subsequent A/D conversion result using the ADC circuit; and
scaling the A/D conversion result to a calibrated A/D conversion using the look-up table.

15. The method of claim 10, including:
deriving a value of a specified calibration function using the calibration information;
determining a subsequent A/D conversion result using the ADC circuit; and
scaling the A/D conversion result to a calibrated A/D conversion using the derived value of the calibration function.

16. The method of claim 10, wherein converting the multiple input voltages to first digital values includes converting the multiple input voltages to the first digital values using a first ADC acquisition time that is an order of magnitude longer than the second ADC acquisition time.

17. The method of claim 10, wherein converting the multiple differential input voltages to the first and second digital values includes converting the multiple differential input voltages to digital values having greater than twenty bits.

18. A non-transitory computer readable storage medium including instructions that, when performed by a controller processor of a calibration device coupled to an analog-to-digital converter (ADC) circuit, causes the calibration device to perform steps comprising:
applying, in a calibration mode, multiple differential input voltages to an input of the ADC circuit, wherein the multiple input voltages are generated using a reference voltage and analog-to-digital (A/D) conversions are performed by the ADC circuit using the reference voltage;
receiving first digital values from the ADC circuit representing A/D conversions of the multiple differential input voltages using a first ADC sample time during the calibration mode;
receiving second digital values from the ADC circuit representing A/D conversions of the same multiple differential input voltages using a second ADC sample time shorter than the first ADC sample time during the calibration mode;

determining calibration information for the ADC circuit using the first digital values of the first ADC sample time and the second digital values of the second shorter ADC sample time; and providing the calibration information to the ADC circuit for subsequent A/D conversions performed in a non-calibration mode.

19. The non-transitory computer readable storage medium of claim 18, including instructions that cause the calibration device to perform steps including generating the multiple differential input voltages using a potentiometer circuit.

20. The non-transitory computer readable storage medium of claim 18, including instructions that cause the calibration device to perform steps including storing the calibration information as a look-up table in a memory circuit coupled to the ADC circuit, the look-up table used by the ADC circuit to scale a subsequent A/D conversion result to a calibrated A/D conversion.

\* \* \* \* \*